United States Patent
Tai et al.

(10) Patent No.: US 6,345,502 B1
(45) Date of Patent: Feb. 12, 2002

(54) MICROMACHINED PARYLENE MEMBRANE VALVE AND PUMP

(75) Inventors: Yu-Chong Tai; Xing Yang; Charles Grosjean; Xuan-Qi Wang, all of Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 0 days.

(21) Appl. No.: 09/191,267

(22) Filed: Nov. 12, 1998

Related U.S. Application Data (60) Provisional application No. 60/065,132, filed on Nov. 12, 1997, and provisional application No. 60/077,945, filed on Mar. 13, 1998.

(51) Int. Cl.[7] ............................. F01B 29/00; F03C 5/00
(52) U.S. Cl. ............................. 60/512; 60/515; 60/530
(58) Field of Search ...................... 60/508, 512, 515, 60/530

(56) References Cited

U.S. PATENT DOCUMENTS

| | | | |
|---|---|---|---|
| 4,016,722 A | * | 4/1977 | Niederer, Sr. .............. 60/530 X |
| 4,824,073 A | | 4/1989 | Zdeblick |
| 5,176,358 A | | 1/1993 | Bonne et al. |
| 5,177,579 A | | 1/1993 | Jerman |
| 5,367,878 A | * | 11/1994 | Muntz et al. ................. 60/512 |
| 6,041,599 A | * | 3/2000 | Obermoser ............... 60/515 X |

* cited by examiner

*Primary Examiner*—Hoang Nguyen
(74) *Attorney, Agent, or Firm*—Fish & Richardson P.C.

(57) ABSTRACT

A micromachined fluid handling device having improved properties. The valve is made of reinforced parylene. A heater heats a fluid to expand the fluid. The heater is formed on unsupported silicon nitride to reduce the power. The device can be used to form a valve or a pump. Another embodiment forms a composite silicone/parylene membrane. Another feature uses a valve seat that has concentric grooves for better sealing operation.

29 Claims, 9 Drawing Sheets

MICROMACHINED PARYLENE MEMBRANE VALVE AND PUMP

CROSS REFERENCE TO RELATED APPLICATIONS

This application claims the benefit of the U.S. Provisional Application No. 60/065,132, filed on Nov. 12, 1997, and No. 60/077,945 filed Mar. 13, 1998, both of which are incorporated herein by reference.

STATEMENT AS TO FEDERALLY SPONSORED RESEARCH

The U.S. Government may have certain rights in this invention pursuant to Grant No. N66001-96-C-8632 awarded by the U.S. Navy.

BACKGROUND

Micromachining is the science of forming various features on silicon structures. These features can be formed to relatively small sizes. Strength of the eventual features is a very important issue.

Thermopneumatic actuation can allow micro-sized fluid handling devices.

SUMMARY

The present disclosure describes using Parylene membranes along with micromachining of structure form various features. Another embodiment uses a composite of Parylene and silicone rubber to obtain certain advantages of each of the materials.

One embodiment teaches using robust Parylene membranes, formed using silicon micromachining technology, to form several fluid handling devices. These include a thermopneumatic actuator, valve, and pump, all of which operate using a heater in a thermopneumatic liquid. These devices have small size, high performance, low cost, and low power.

Another embodiment teaches using a composite of Parylene and silicone rubber.

BRIEF DESCRIPTION OF THE DRAWINGS

These and other aspects of the invention will now be described with reference to the attached drawings, in which.

DESCRIPTION OF THE PREFERRED EMBODIMENTS

The present embodiment describes formation of a Parylene membrane. Parylene is available from Specialty Coating Systems, Inc., 5707 West Minnesota Street, Indianapolis, Ind. 46241. The basic process is shown in FIGS. 1A–1F.

Figure 1A:
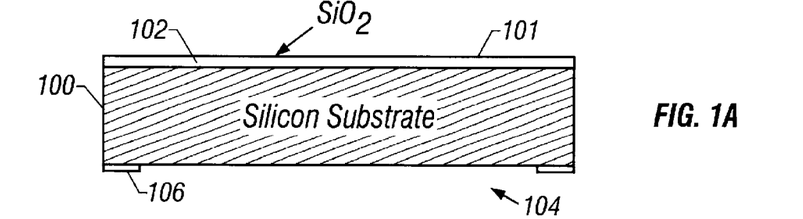
FIGS. 1A–1F show stages of forming the Parylene membrane.

First, a silicon substrate 100 is heated at 1050° C. to form a 2 $\mu$m thick silicon dioxide layer of native oxide 102 on its front surface 101. The silicon dioxide layer 102 is formed on the front surface 101. The rear surface 104 is also formed with a silicon dioxide layer 106. The rear layer 106 is patterned and etched using buffered hydrofluoric acid ("BHF") to open windows 104. The wafer front side, and the remaining areas 106, can be covered with photoresist during this time.

Figure 1B:
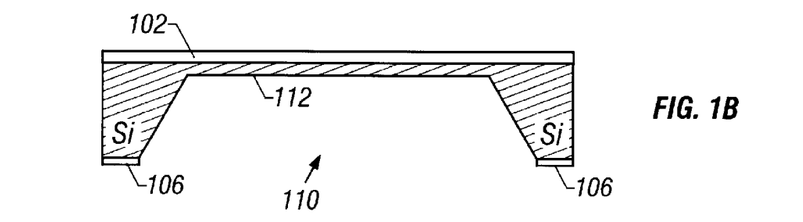

FIG. 1B shows a window 110 being opened in the silicon back side 104, between the silicon dioxide layers 106, using anisotropic etching. The preferred anisotropic etchant is KOH. This etches the silicon substrate until the thinned silicon portion 112 is between 20 and 100 $\mu$m thick.

Figure 1C:
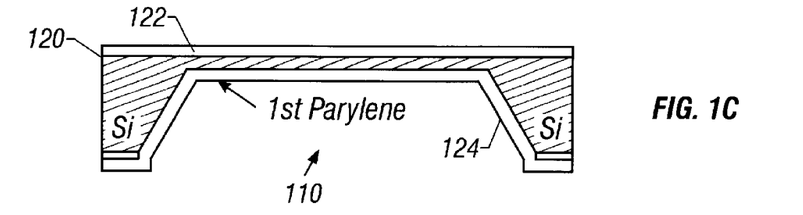

At this time, the silicon dioxide layer 102 is removed from the front layer. This is done by using buffered hydrofluoric ("BHF") acid. A 2 $\mu$m thick layer 120 of Parylene is deposited over the entire wafer front and back. This includes a deposition on the front surface 122 and a deposition 124 in the window area 110.

Figure 1D:
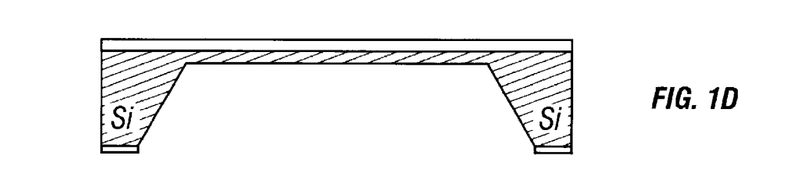
Figure 1E:
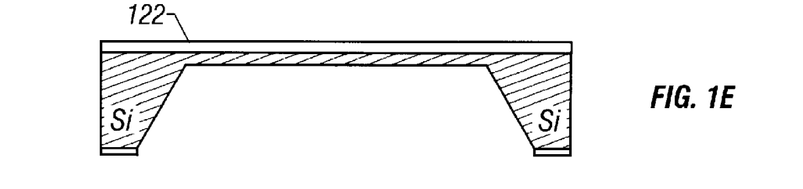

In FIG. 1D, the back side Parylene 124 is removed using an oxygen plasma. This is followed by removing the thinned silicon 112 layer using $BRF_3$, leaving a free-standing Parylene layer 122.

Figure 1F:
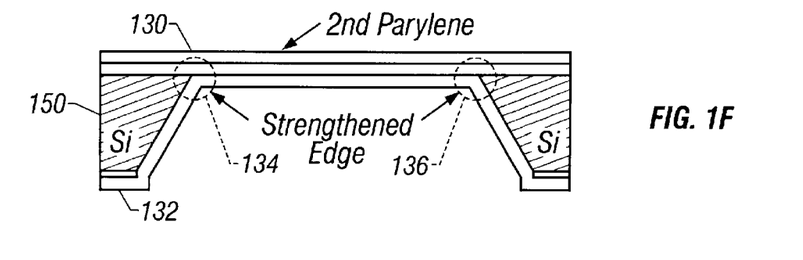

FIG. 1F shows a second Parylene deposition process which again deposits the material over the entire surface of both sides. The second Parylene layer results in a top layer 130 and a bottom layer 132. Notably, the bottom layer 132 results in significant edge membrane strengthening.

The result is that a strengthened-edge Parylene membrane which is unsupported by silicon, is formed between the edge portions 134 and 136.

Thermopneumatic actuation uses a heater to heat up a thermopneumatic liquid, and cause it to expand and contract. It is desirable to have a thermally efficient heater to minimize the amount of power necessary to heat the liquid.

Figure 2:
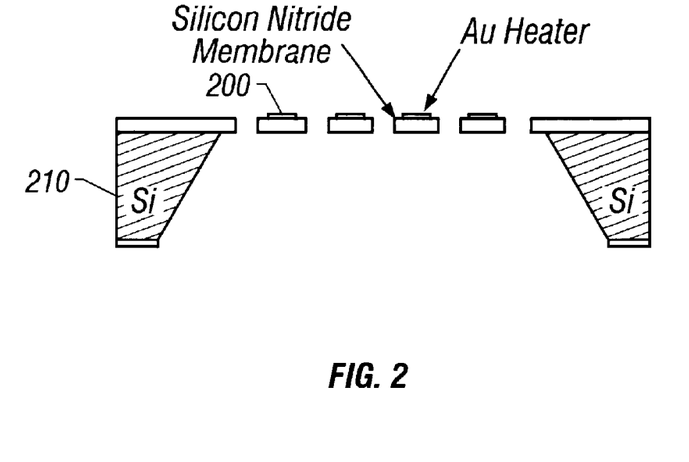
FIG. 2 shows a cross section of the heater.
Figure 3:
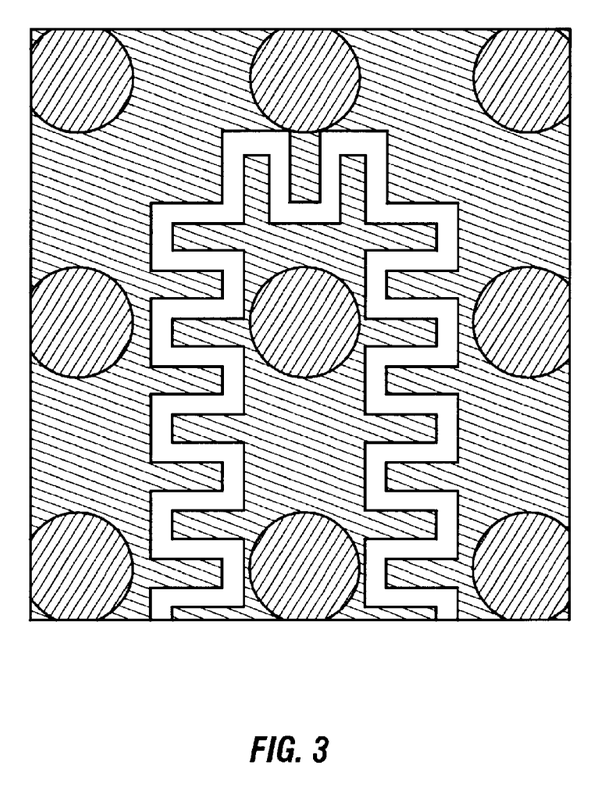
FIG. 3 shows a top view of the heater.

FIGS. 2 and 3 show a thermally efficient heater as used according to the preferred embodiment. FIG. 2 shows a cross sectional view of the heater. A free-standing silicon nitride membrane is formed using a technique described in further detail herein. Gold heaters 200 are formed on the free-standing silicon nitride substrate. Silicon nitride has a very low thermal conductivity, and forms a very thin membrane, e.g. 0.5 $\mu$m thick, less preferably less than 1 $\mu$m thick, or less than 2 $\mu$m thick. The thin membrane is preferably unsupported by any higher thermal conductivity material. This yields a very high thermal resistance which minimizes undesired heat loss.

FIG. 2 shows the cross sectional view of the heater, while FIG. 3 shows a drawing of the fabricated heater looking from the top. The holes in the membrane help to equalize the pressure on the front and back of the membrane. It has been found through experiments with only 52.2 milliwatts of power, the surface of the gold heater can reach 200° C. The heater material is preferably formed in a zig-zag pattern as shown.

FIGS. 4A–4E show the fabrication process of the heater. First, a layer of thermal conductivity material, preferably a ½ $\mu$m thick, low stress LPCVD silicon nitride 400 is deposited on the silicon substrate 402. The silicon nitride is deposited at 850° C. with a $SIH_2Cl_2:NH_3$ gas flow ratio of 4 to 1. Windows 404 are opened on the back side of the wafer. This can be done using dry etching with the desired portions being covered with photoresist.

Figure 4A:
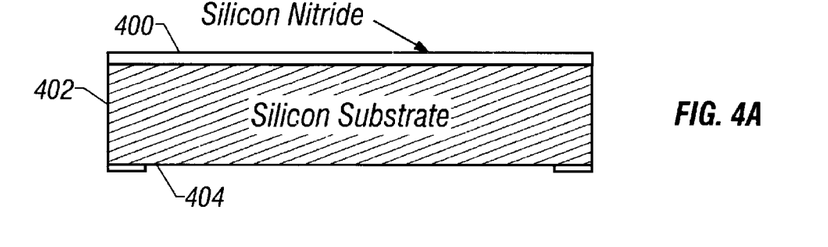
FIGS. 4A–4E show steps of forming the heater.
Figure 4B:
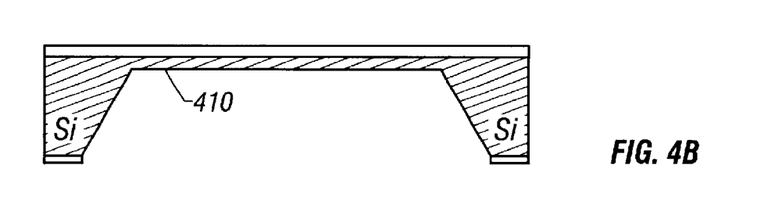

FIG. 4B shows an anisotropic etching step in which the wafers are etched in an anisotropic etchant such as KOH. This leaves a thin silicon area 410 which is between 20–100 μm thick.

Figure 4C:
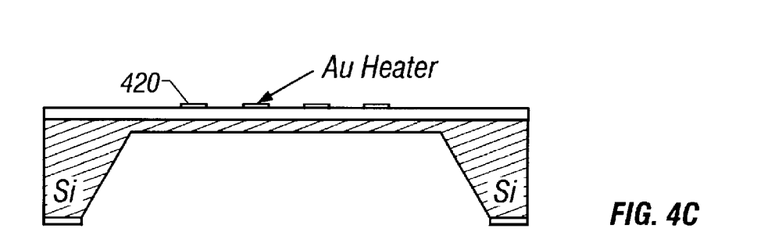

FIG. 4C shows the gold heater deposition, in which a layer of resistive material, e.g., Cr/Au, is thermally evaporated on the front side of the wafers. The material is patterned to define the resistive pattern that is desired. Preferably the zig-zag shaped resistive pattern shown in FIG. 3 is used.

Figure 4D:
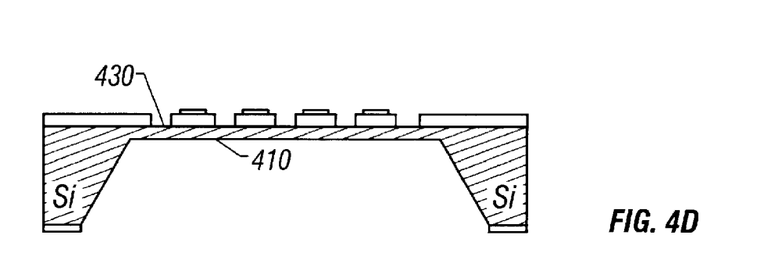

An array of holes such as 430 is then etched into the silicon nitride layer using RIE as shown in FIG. 4D.

Figure 4E:
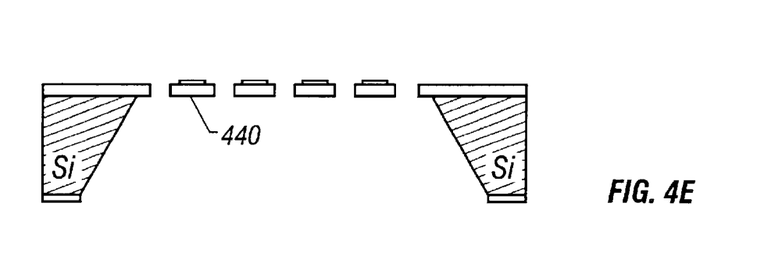

Finally, the wafer is put back into the anisotropic solution of KOH to remove the thin silicon area 410, leaving a free-standing silicon nitride element shown in FIG. 4E.

Figure 5:
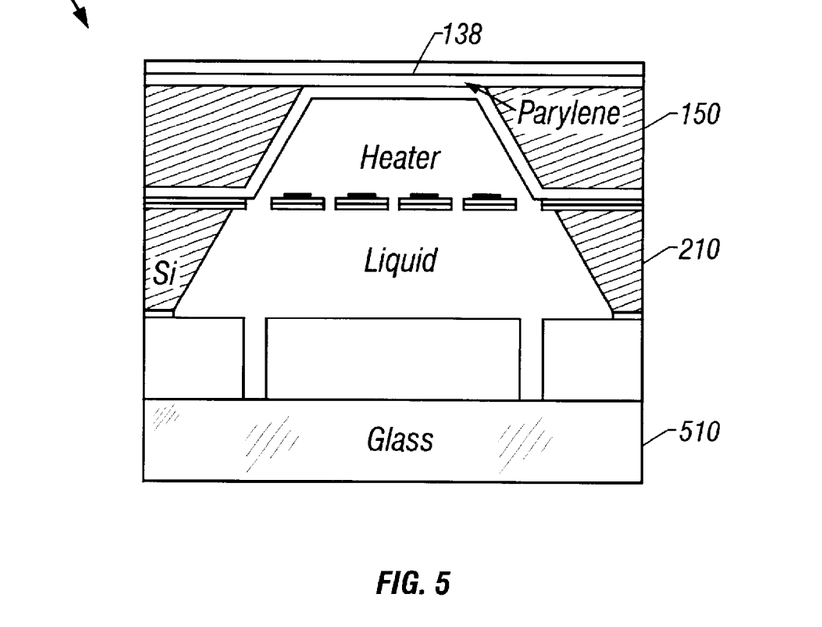
FIG. 5 shows a cross section of a thermopneumatic actuator.

FIG. 5 shows the overall view of the thermopneumatic actuator assembled using the components above. The thermopneumatic actuator is made by assembling a Parylene membrane chip 150 as shown in FIG. 1F on top of the heater chip 210 shown in FIG. 2.

The cavity formed between the chips is filled with a thermopneumatic liquid 502 which is preferably an expansive liquid. The cavity is also sealed by a stacking plate. A bottom layer of glass 510 is formed to seal the device.

This device can be used with various liquids including air, 3 M fluorinert PF5060, in either 50% solution or full solution, alcohol, water, distilled water, or PF5070. The PF5060 is believed to give the best performance. This forms the actuator, which can be used with various other structure.

Figure 6:
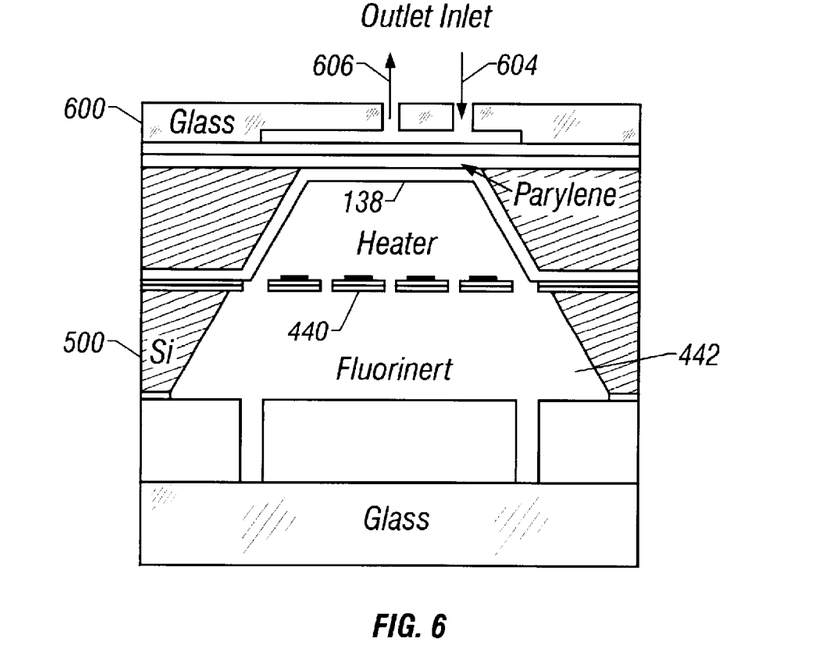
FIG. 6 shows a cross section of a normally open valve.

FIG. 6 shows the actuator device 500 being topped with a valve device 600. The Parylene membrane portion 138 forms the actuator for the valve device. The valve shown in FIG. 6 is normally opened, and fluid can pass from its inlet 604 to its outlet 606. When the heater 440 is actuated, the fluid in cavity 442 expands, causing the Parylene membrane 138 to bubble up and block the communication between the inlet 604 and the outlet 606.

Figure 7:
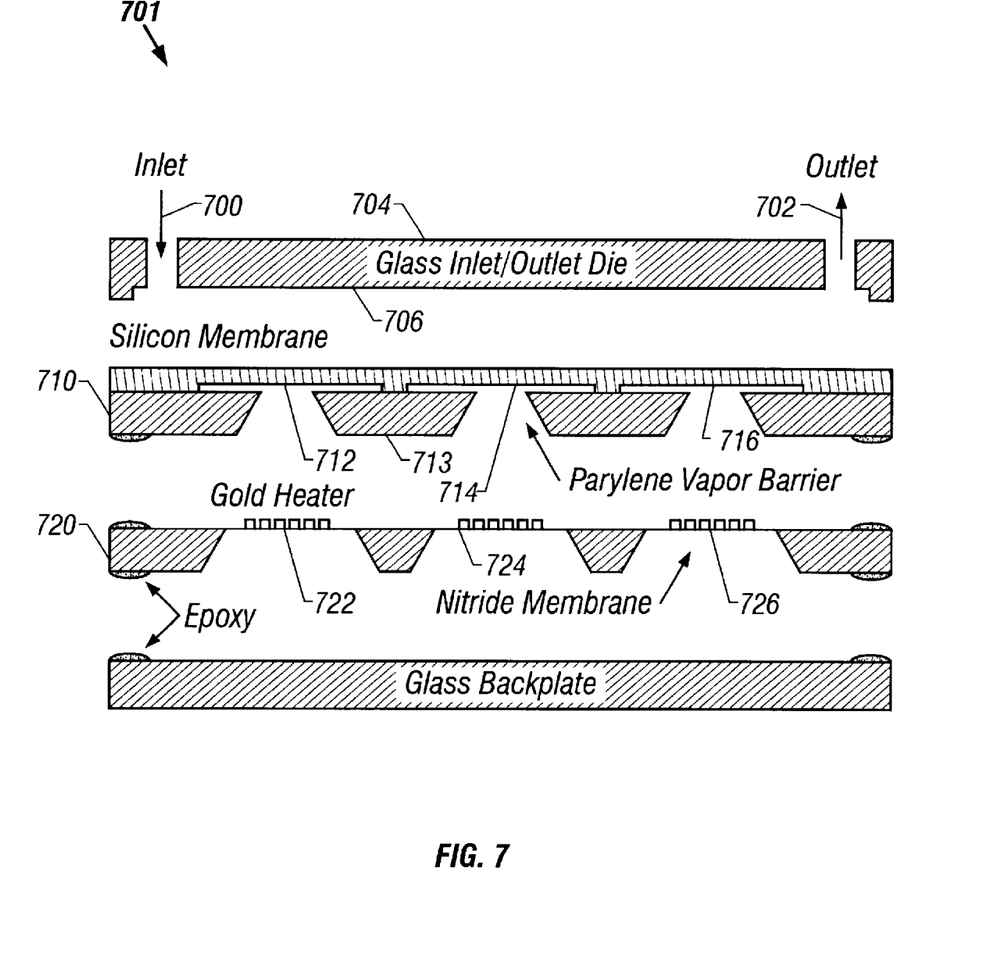
FIG. 7 shows a peristaltic pump.

FIG. 7 shows a thermopneumatic peristaltic pump formed using similar technology. This pump is made by putting three or more thermopneumatic actuators in line on a single substrate inside a housing 701. The overall device is shown in FIG. 7. A glass inlet/outlet die 704 is formed and fluid enters through the inlet 700 and exits through the outlet 702.

Layer 710 is a silicone membrane with a fluid impermeable layer—preferably a Parylene vapor barrier. Each Parylene vapor barrier forms an actuator, which selectively extends all the way up to the bottom surface 706 of the glass inlet/outlet die when heated by an associated heater 722. The Parylene membranes 712, 714, 716 are actuated by respective heaters 722, 724, 726 in the layer 720. For instance, the heater 722 is heated to actuate the liquid close to heater 722, to expand the Parylene membrane 712. Separators between the adjacent cavities are formed by the silicon areas 713.

In operation, the actuators are deflected sequentially from left to right, with a small overlap period. This effectively pumps the liquid from the inlet to the outlet. First, the heater 722 is actuated, and during its deactuation, the heater 724 is actuated. During that deactuation, the heater 726 is actuated. This pumps the liquid from inlet to outlet.

Both Parylene and Parylene/silicon membranes can be used for the actuator. Parylene has been shown to be an effective vapor barrier for 3M fluorinert liquids.

The heaters are fabricated in a similar manner to that described above, except that three or more heaters are fabricated on the same substrate. The heaters and the membranes are formed with similar spacing to form a single peristaltic pump.

The fabrication process is similar to that described above. In addition, a layer of silicone rubber can be added to the Parylene to aid in robustness.

In addition, higher density and lower dead volume can be carried out using a special process with a polysilicon sacrificial layer. This can be used to achieve closer membrane spacing and better surface coverage than the other membranes formed by simple anisotropic etching. FIGS. 8A–8G shows this alternative embodiment. This, however, has the additional complexity of requiring etching a polysilicon spacer/sacrificial layer after the Parylene membranes are formed.

Figure 8A:
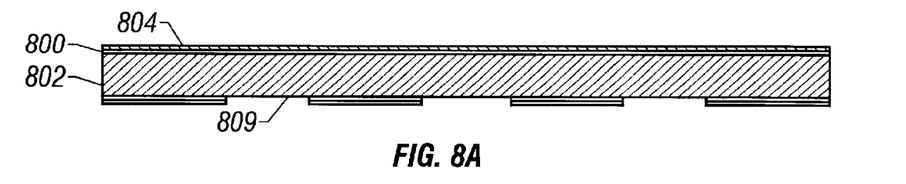
FIGS. 8A–8G show steps of forming a high density membrane.

FIG. 8A shows both thermal oxide layer 800 and a silicon nitride layer 804. The back side layers are patterned as described previously to open windows 809.

Figure 8B:
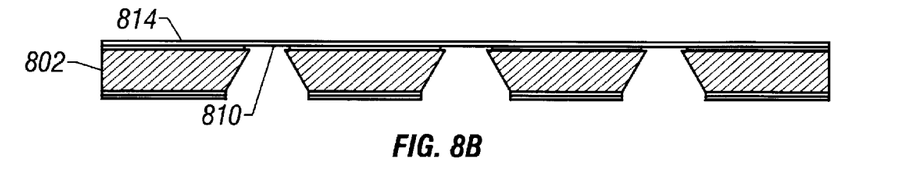

In FIG. 8B, cavities 810 are opened in the silicon 802 using KOH. The oxide layer 800 is also stripped from the back side of the openings to leave free-standing SiN portions 814.

Figure 8C:
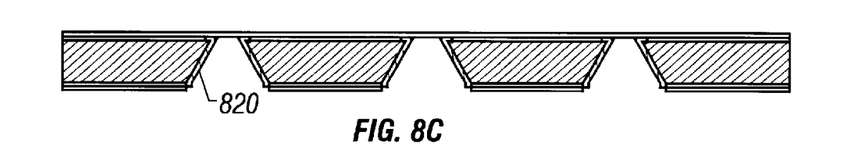

Step 8C shows further passivating the walls of the windows with a thermal oxide 820. The silicon substrate needs to be completely passivated in order to obtain high selectivity when using bromium trifluoride. The free-standing $S_1N$ membranes 814 are also covered with thermal oxide 820 covering all of the other surfaces.

Figure 8D:
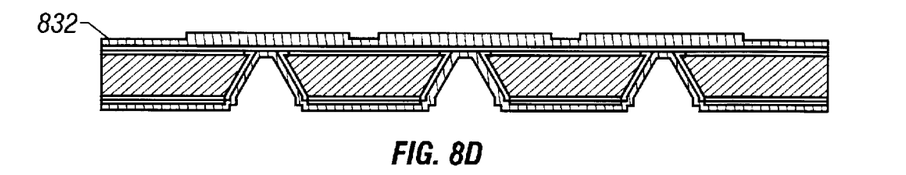

In step 8D, polysilicon 830 is grown on the top and bottom surfaces using a positive photoresist. This pattern forms the membrane areas.

Figure 8E:
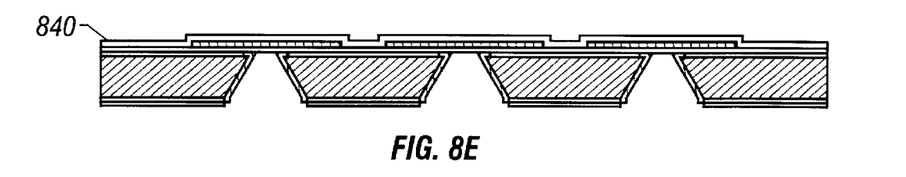
Figure 8F:
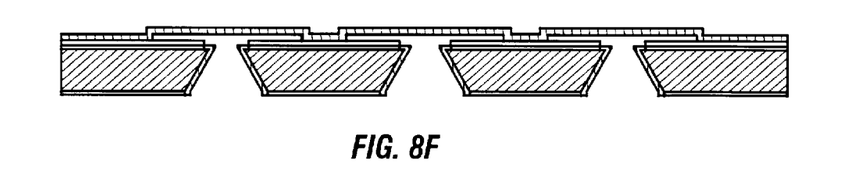
Figure 8G:
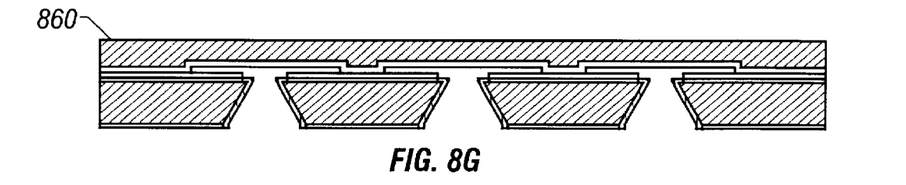

FIG. 8E shows Parylene layer 840 being deposited over the front surface to form the final membrane material. The silicon nitride membranes are removed using plasma, and polysilicon is removed and undercut with bromium trifluoride as shown in FIG. 8F. This leaves closely packed Parylene membranes. FIG. 8G shows an additional layer 860 of silicon rubber being deposited on top of the overall substrate as a strengthening layer.

Silicone is an interesting material for the valves. Silicone rubber has a low modulus, approximately 1 MPa, good compatibility with IC processes and high elongation. The sealing process of silicone rubber is quite excellent. Silicone rubber can seal against rough surfaces, and still have virtually zero flow rate when closed. However, a main issue with silicone rubber is that it is permeable to and absorbs much of the liquids that have otherwise been used for thermopneumatic actuation.

The embodiment as described herein uses a composite membrane technology. The membrane is in contact with liquid in a micromachined cavity within a silicon substrate. An impermeable film is used between the liquid and silicone rubber in order to prevent the liquid from leaking out. This embodiment uses Parylene as the impermeable film. Parylene also has a very low modulus, as well as low permeability to the thermopneumatic actuation fluids including fluorinert, water, isopropyl alcohol, and the like. The Parylene layer is connected to an elastomeric substance, preferably silicone rubber.

This embodiment uses a heater as shown in FIGS. 2 and 3, sitting on a relatively thin free-standing silicon nitride membrane. The membrane is preferably less than 0.5 μm in thickness, and silicon nitride also has a very small thermal conductivity. This reduces the heat loss and hence improves the power efficiency.

Another embodiment is disclosed herein includes a novel valve seat. This novel valve seat uses concentric grooves etched into the substrate around the hole. The grooves reduce the chance of the particles sticking near the inlet and outlet. They also form a redundant seal and reduce the leak possibility of the valve when closed.

Figure 9A:
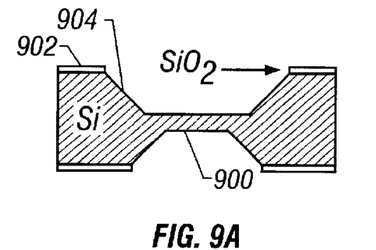
FIGS. 9A–9F show forming a composite silicone/parylene membrane.

FIGS. 9A–9F represent the composite silicone/Parylene membrane fabrication process. FIG. 9A shows first forming a 2 $\mu$m thick silicon oxide via thermal oxidation on the wafer surface. This layer is used as a barrier to etching. Etching windows are opened by patterning that silicon oxide layer using photolithography. Buffered hydrofluoric acid, for example, can be used to selectively remove the etch barrier.

The wafers are then immersed into an anisotropic silicon etchant such as KOH. This etches the silicon wafer from both the front and back side until approximately a 20 $\mu$m thick silicon membrane 900 remains in the middle of the wafer.

Figures 9B, 9E:
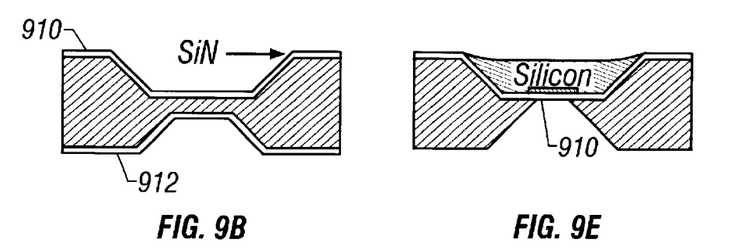

At this time, the remaining silicon oxide 902 is removed using BHF. Step 9B illustrates growing isolation layers, preferably silicon nitride layers, approximately 0.5 $\mu$m thick, on both surfaces of the substrate using low pressure chemical vapor deposition. The silicon nitride layer 912 on the back surface is removed using $CF_4/O_2$ plasma etching. This leaves only the silicon nitride 910 on the front surface.

Figure 9C:
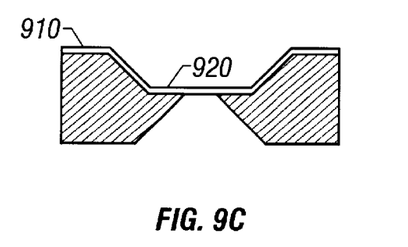
Figure 9D:
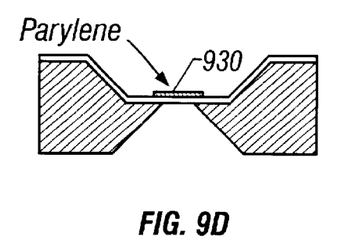

FIG. 9C illustrates replacing the wafers into a KOH solution to etch away the remaining 20 $\mu$m thick silicon layer in the middle of the wafer 900. This forms a free-standing portion 920 of the silicon nitride membrane 910. FIG. 9D illustrates forming a 2 $\mu$m thick layer of thermopneumatic-impermeable material, preferably Parylene, 930, on the top of the free-standing layer, but extending beyond the edges of the free-standing layer. This can be formed, for example, using a vapor deposition process. Again, the photolithography process is used to pattern the Parylene layer, followed by selective removal using oxygen plasma etching.

Figure 9F:
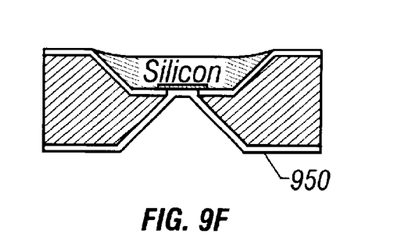

The remainder of the well 904 is then filled with elastomeric material, preferably silicone rubber on the front side. The silicon nitride 910 can then be removed from the back side using $CF_4/O_2$ plasma etching. Finally, another layer 950 of 2-micron thick Parylene is deposited on the back side of the wafer to replace the removed silicon nitride layer.

This forms a composite silicon/Parylene membrane.

Figure 10:
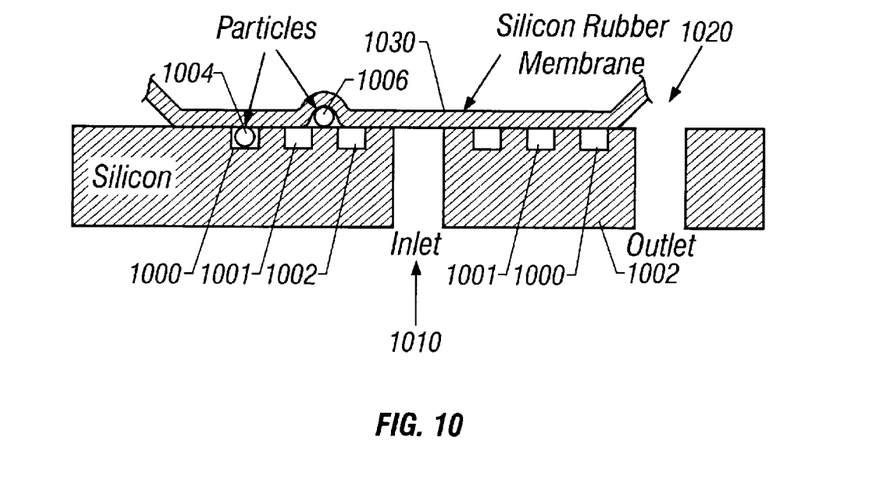
FIG. 10 shows a valve seat in cross section.

A valve seat embodiment is described with reference to FIGS. 10, and 12A–12C. This special valve seat has concentric grooves instead of simple holes for inlet and outlet. The grooves reduce the chance of particles becoming obstructions near the inlet and outlet, by effectively serving as particle traps. FIG. 10 in fact shows a sample particle 1004 trapped in one of the grooves 1000. Another particle 1006 is shown out of a groove. However, since silicone rubber is elastomeric, it can completely wrap around the particle 1006, as shown. The grooves form a reliable and redundant seal. When closed, the grooves reduce the leak rate between the inlet 1010 and the outlet 1020.

Figure 11:
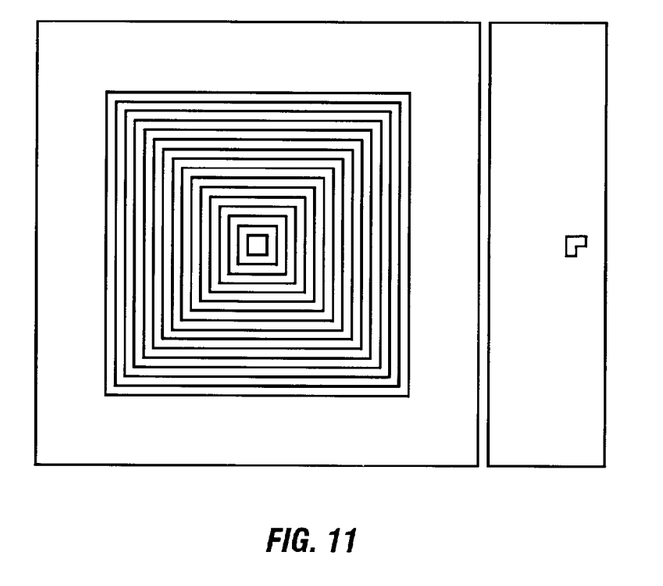
FIG. 11 shows the valve seat from above.

As discussed above, the system preferably includes a number of sets of concentric grooves 1000, 1001, and 1002, concentrically surrounding the inlet 1010. FIG. 11 shows 17 sets of grooves, but any number of sets of grooves between 2 sets of grooves and 30 sets of grooves is within the preferred embodiment. The grooves could alternately be formed surrounding the outlet 1020, if the outlet is being sealed. The membrane 1030 is formed of an elastomer, e.g., silicone rubber.

Figure 12A:
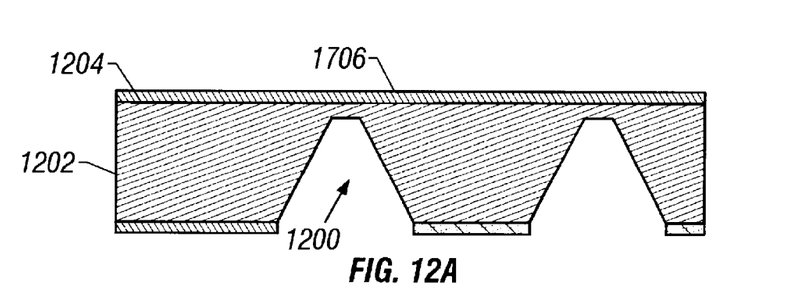
FIGS. 12A–12C shows forming the valve seat.

The valve seat fabrication process is illustrated in FIG. 12. First, a 2-micron thick silicon dioxide 1204 is thermally grown on the wafer at 1050° C. As in previous embodiments, the silicon dioxide layer on the wafer backside is patterned using photolithography and KOH and then etched using buffered hydrofluoric acid to open window 1200 in the wafer. Preferably, the etching continues until approximately a 15 $\mu$m silicon area is left at area 1206.

Figure 12B:
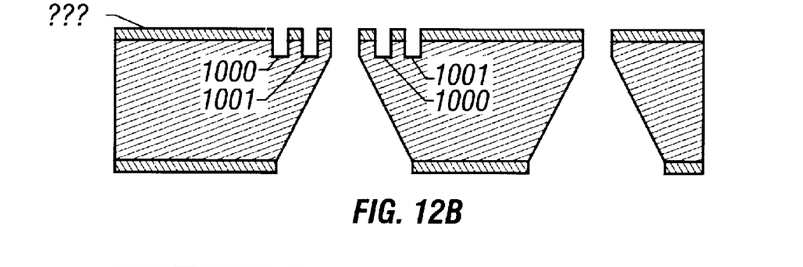
Figure 12C:
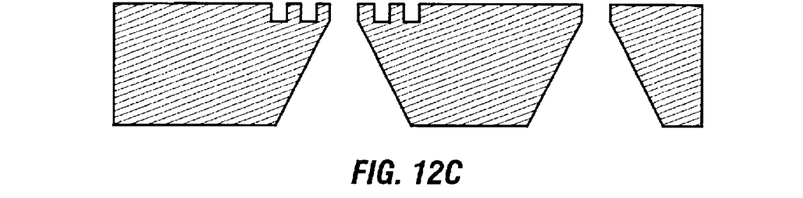

FIG. 12B illustrates etching the grooves 1600, 1602 into the top surface 1210 of the substrate using reactive ion etching. Finally, the silicon dioxide layer 1204 is totally removed as shown in FIG. 12C using BHF.

The fabricated valve seat is shown in FIG. 11. In this embodiment, the groove portions of the valve are formed in concentric squares, although any shape could be used.

Figure 13:
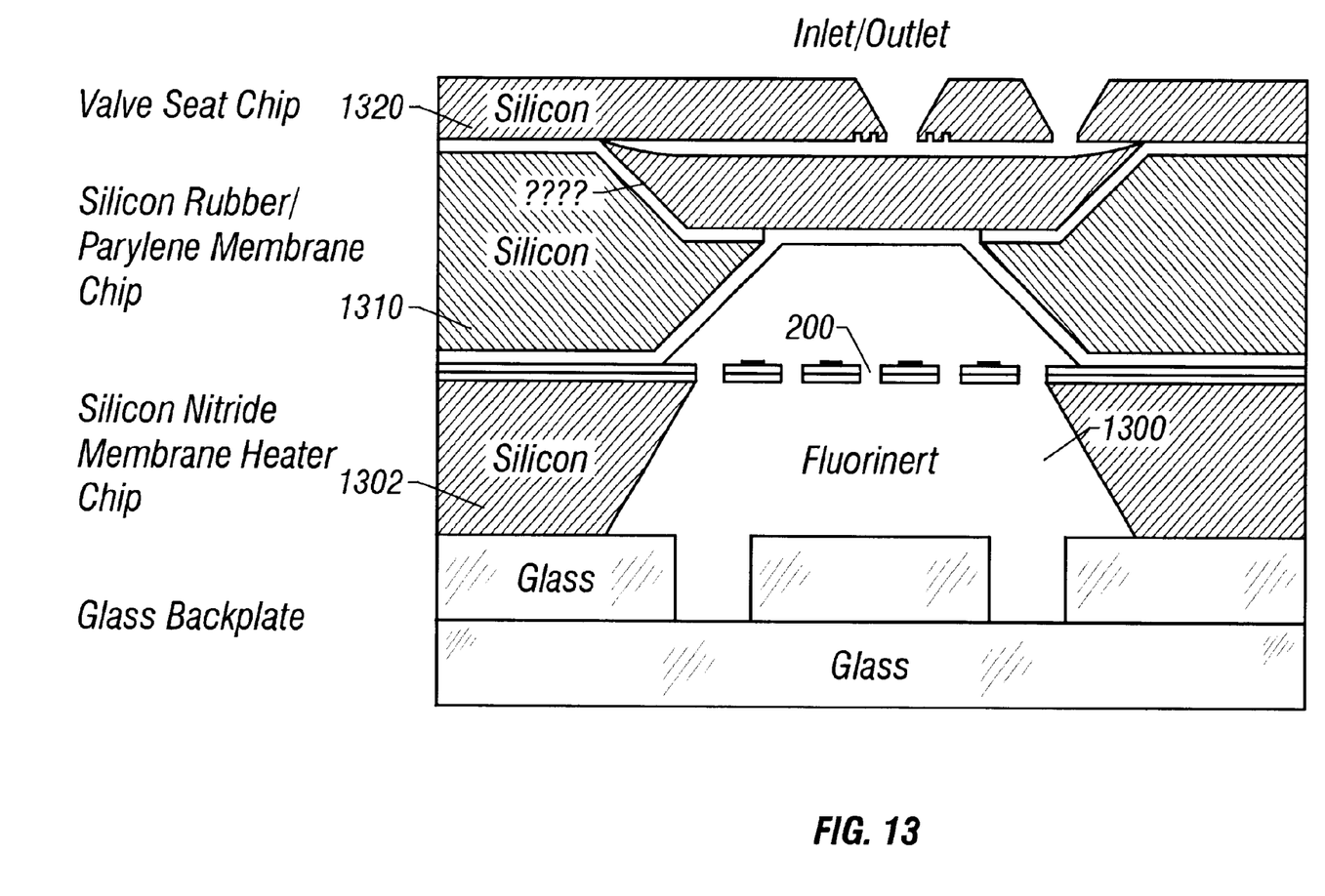
FIG. 13 shows a cross sectional view of the valve.

FIG. 13 shows a cross section of the final valve. The system includes the heater as shown in FIGS. 2–4, formed in a cavity 1300 that is filled with thermopneumatic fluid, e.g., fluorinert. The silicone rubber/Parylene membrane chip portion 1310 is of the type described above. The valve seat chip portion 1320 uses the type of valve seat shown in FIGS. 11 and 12.

Each of the chips can be more or less the same thickness, or of different thicknesses. If the chips 1310 and 1302 are similar thicknesses, then the heater 200 will be substantially centered in the cavity 1300, as is preferred.

In operation, when no power is applied, the valve is open. When electrical power is applied to the gold resistors 200, the fluorinert expands. This raises the pressure inside the cavity 1300 which outwardly deflects the flexible silicone rubber/Parylene membrane 1310. This presses that membrane against the valve seat thereby shutting off communication between the inlet and the outlet.

Although only a few embodiments have been described in detail above, other embodiments are contemplated and are intended to be encompassed within the following claims. In addition, other modifications are contemplated and are also intended to be covered.

For instance, other elastomeric materials and fluid impermeable materials could be used in place of the preferred silicone rubber and Parylene. Also, another low thermal material could be used in place of the silicon nitride. Certain ones of the semiconductor processing steps could be omitted or changed.

All such modifications are intended to be encompassed within the claims.

What is claimed is:

1. A thermopneumatic actuator comprising:
   a base;
   a cavity formed from sidewalls of micromachined silicon;
   a membrane, formed from a silicon substrate, formed to have first and second sidewalls and an open space between said first and second sidewalls, a first layer of membrane material extending over said open space; and a second layer of membrane material, extending along said sidewalls, under said first layer of membrane material to thereby form strengthened edge portions at locations where said sidewalls meet said first layer of membrane material; and
   a free standing heater, located in said cavity and formed from a thinned material which has low thermal conductivity, and operating to selectively heat thermopneumatic liquid in said cavity to expand the membrane or cool the thermopneumatic liquid to contract the membrane.

2. An actuator as in claim 1, wherein said heater comprises:

a supporting sidewall formed of a silicon material;

a thin material of a thickness less than 2 $\mu$m thick, having a low thermal conductivity, extending between said sidewalls, and having an unsupported portion which is unsupported by any material with a higher thermal conductivity; and a heater, formed on said unsupported portion of said low thermal conductivity material.

3. An actuator as in claim 2, wherein said thin material is less than 1 $\mu$m in thickness.

4. An actuator as in claim 2, wherein said thin material is SiN.

5. An actuator as in claim 2, wherein said membrane is formed of a material including Parylene.

6. An actuator as in claim 5, wherein said membrane is formed of a material including a first portion which is resistant against infiltration by said thermopneumatic fluid, and a second portion, which is not in contact with said themopneumatic fluid, and which includes an elastomeric sealing portion.

7. An actuator as in claim 6, wherein said elastomeric sealing portion is silicone rubber.

8. An actuator as in claim 2, wherein said resistive material is formed in a zig zag portion, and said low thermal conductivity material includes holes therein adjacent to said zig zag portion.

9. An actuator as in claim 8, wherein said resistive material is formed of gold.

10. A peristaltic pump, comprising:

a housing;

a plurality of heaters, located in series with one another and inside said housing spaced from one another at a predetermined spacing;

each said heater comprising a supporting sidewall formed of a silicon material; a thin material of a thickness less than 2 $\mu$m thick, having a low thermal conductivity, extending between said sidewalls, and having an unsupported portion which is unsupported by any material with a higher thermal conductivity; and a resistive heater portion, formed on said unsupported portion of said low thermal conductivity material;

a plurality of expandable membranes, located spaced a similar spacing to a spacing between said heaters and located adjacent said heaters; and an inlet outlet portion, having an inlet near a first of said membranes, an outlet near a last of said membranes, wherein said heaters are selectively actuated in turn to expand said membranes and to pump fluid from said first membrane via the other membranes finally to last membrane and out said outlet.

11. A pump as in claim 10, wherein said membranes each comprise:

a silicon substrate, formed to have first and second sidewalls and an open space between said first and second sidewalls;

a first layer of Parylene membrane, extending over said open space; and a second layer of Parylene membrane, extending along said sidewalls, under said first layer of Parylene to thereby form strengthened edge portions at locations where said sidewalls meet said first layer of Parylene.

12. A pump as in claim 10, wherein said membranes each comprise a first material which is impermeable to thermopneumatic fluid and a second material which is elastomeric.

13. A pump as in claim 10, wherein said thin material is SiN.

14. A pump as in claim 13, wherein said thin material is less than 0.5 $\mu$m thick.

15. A pump as in claim 10, wherein said membranes are formed of Parylene.

16. A pump as in claim 10, wherein said membranes are formed of Parylene and elastomer material.

17. A pump as in claim 16, wherein said elastomer material is silicone rubber.

18. A pump as in claim 10, wherein said heater includes holes therein.

19. A pump as in claim 10 further comprising a layer of silicon rubber.

20. A thermopneumatic device, comprising a micro machined cavity, having walls formed of silicon and holding an thermopneumatically expandable liquid;

a heater, located within said cavity, and selectively actuated to selectively expand said liquid and de-actuated to contract said liquid; and a membrane, in contact with liquid in the cavity, having a liquid impermeable film layer which has low permeability to the thermopneumatic actuation fluid, and an elastomeric substance, forming a sealing surface, said elastomeric material being isolated from the thermopneumatic actuation fluid by said liquid impermeable layer.

21. A device as in claim 20 wherein said impermeable layer is formed of Parylene.

22. A device as in claim 21 wherein said elastomeric substance is silicon rubber.

23. A device as in claim 22 wherein said heater is a resistive element on a free standing silicon nitride membrane.

24. A device as in claim 23 wherein said silicon nitride membrane is less than ½ in thickness.

25. A device as in claim 20 wherein said heater is formed with holes therein.

26. A device as in claim 20, wherein said heater is a resistive element on a substrate less than 1 $\mu$m thick, and unsupported by any silicon substrate.

27. A device as in claim 20, wherein said heater is formed on a low thermal conductivity material.

28. A device as in claim 20, wherein said heater is formed of gold.

29. A device as in claim 28, wherein said heater is formed with holes therein.

* * * * *